US008713505B2

(12) United States Patent
Hosono (10) Patent No.: US 8,713,505 B2
(45) Date of Patent: Apr. 29, 2014

(54) PATTERN GENERATION METHOD AND PATTERN GENERATION PROGRAM

(75) Inventor: Koji Hosono, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 393 days.

(21) Appl. No.: 12/923,512

(22) Filed: Sep. 24, 2010

(65) Prior Publication Data

US 2011/0018879 A1 Jan. 27, 2011

Related U.S. Application Data

(63) Continuation of application No. PCT/JP2008/058958, filed on May 15, 2008.

(51) Int. Cl.
*G06F 17/50* (2006.01)
(52) U.S. Cl.
USPC ............................................. 716/119
(58) Field of Classification Search
USPC ............................................. 716/100
See application file for complete search history.

(56) References Cited

U.S. PATENT DOCUMENTS

| 7,365,431 | B2* | 4/2008 | Matsubara | 257/758 |
|---|---|---|---|---|
| 7,478,328 | B2* | 1/2009 | Hannebauer et al. | 715/731 |
| 8,095,903 | B2* | 1/2012 | Birch et al. | 716/126 |
| 2005/0179134 | A1* | 8/2005 | Matsubara | 257/758 |
| 2008/0028352 | A1* | 1/2008 | Birch et al. | 716/12 |
| 2010/0020101 | A1* | 1/2010 | Schormann | 345/654 |
| 2010/0229140 | A1* | 9/2010 | Strolenberg et al. | 716/9 |

FOREIGN PATENT DOCUMENTS

| JP | 62-43778 | 2/1987 |
|---|---|---|
| JP | 1-54279 | 6/1989 |
| JP | 1-154279 | 6/1989 |
| JP | 03-149663 | 6/1991 |
| JP | 11-39372 | 2/1999 |
| JP | 11-274306 | 10/1999 |
| JP | 2000-100688 | 4/2000 |
| JP | 2000-310844 | 11/2000 |
| JP | 2006-267879 | 10/2006 |

OTHER PUBLICATIONS

Patent Abstracts of Japan, Publication No. 2000-100688, Published Apr. 7, 2000.
Patent Abstracts of Japan, Publication No. 62-043778, Published Feb. 25, 1987.
Patent Abstracts of Japan, Publication No. 2000-310844, Published Nov. 7, 2000.

(Continued)

*Primary Examiner* — Suchin Parihar
(74) *Attorney, Agent, or Firm* — Staas & Halsey LLP (57) ABSTRACT

In a first process of a pattern generation method, a first segment to be handled which is not on a grid is extracted. In a second process, a second segment opposite to the first segment is extracted. In a third process, whether the second segment is on the grid is determined. In FIG. 1A, the second segment is not on the grid. Therefore, in a fourth process the first segment is shifted onto the grid under a determined condition. In addition, the second segment is shifted onto the grid so that line width between the first segment and the second segment is closest to target line width.

5 Claims, 10 Drawing Sheets

(56) References Cited

OTHER PUBLICATIONS

Patent Abstracts of Japan, Publication No. 2006-267879, Published Oct. 5, 2006.
Patent Abstracts of Japan, Publication No. 11-274306, Published Oct. 8, 1999.
Patent Abstracts of Japan, Publication No. 11-039372, Published Feb. 12, 1999.
Patent Abstracts of Japan, Publication No. 03-149663, Published Jun. 26, 1991.
Patent Abstracts of Japan, Publication No. 01-154279, Published Jun. 16, 1989.

* cited by examiner

PATTERN GENERATION METHOD AND PATTERN GENERATION PROGRAM

This application is a continuing application, filed under 35 U.S.C. §111(a), of International Application PCT/JP2008/058958, filed on May 15, 2008.

FIELD

The embodiments discussed herein are related to a pattern generation method and a pattern generation program.

BACKGROUND

The formation of very minute patterns is needed in the manufacture of recent LSI (Large-Scale Integration).

In order to enhance the faithfulness of patterns after transfer onto semiconductor substrates (wafers), usually an OPC (Optical Proximity Correction) process is performed in the manufacture of the recent LSI. With the OPC process, design data indicative of a figure is transferred onto a wafer and the figure on the wafer is transformed into a shape indicated by the design data.

In order to perform the OPC process, various methods are used according to accuracy needed. With a model-based OPC process generally used for forming recent minute patterns, a figure after the OPC process is determined by simulation.

The figure determined by simulation is an ideal value calculated by computation. Therefore, when manufacturing data is actually generated, a segment (side) obtained from the ideal value may be a segment (hereinafter referred to as an "off-grid segment") which is not on a grid. In this case, it is necessary to rearrange (round off) the segment on the grid.

In addition, if a process in which input data and output data differ in grid is performed in pattern data processing other than the OPC process for manufacturing semiconductor devices, an off-grid segment may appear.

A method for arranging an off-grid segment which appears on a grid specified by a user for the purpose of arranging it on a grid is known (see, for example, Japanese Laid-open Patent Publication. No. 2000-100688).

Furthermore, a method for arranging an off-grid segment on a grid by making a grid finer is known (see, for example, Japanese Laid-open Patent Publication. No. 62-043778).

If an off-grid segment is arranged on a grid, usually the following method is used. The amount of deviation between the off-grid segment and the grid is determined. There are two grid lines adjacent to the off-grid segment. The off-grid segment is arranged on one of the two grid lines which is closer to the off-grid segment so that the amount of deviation between the off-grid segment and a segment obtained by arranging the off-grid segment on the grid will be minimized.

Figure 10A:
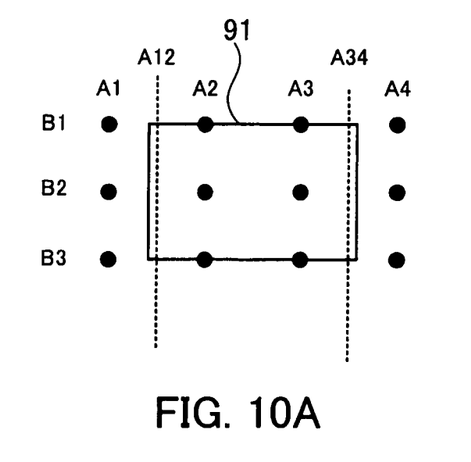
FIG. 10 illustrates a method for arranging an off-grid segment on a grid.

FIG. 10 illustrates a method for arranging an off-grid segment on a grid.

Points for visually confirming the grid are indicated on the grid at determined intervals. In addition, the symbols A1 through A4 for identifying columns of the grid and the symbols B1 through B3 for identifying rows of the grid are indicated.

In FIG. 10, left-hand and right-hand sides of a rectangle 91 are not arranged on the grid and are off-grid segments.

A virtual line A12 is virtually drawn midway between the column A1 (hereinafter referred to as the "grid line A1") and the grid line A2. The left-hand side of the rectangle 91 is on the grid line A1 side from the virtual line A12.

A virtual line A34 is virtually drawn midway between the grid line A3 and the grid line A4. The right-hand side of the rectangle 91 is on the grid line A4 side from the virtual line A34.

Figure 10B:
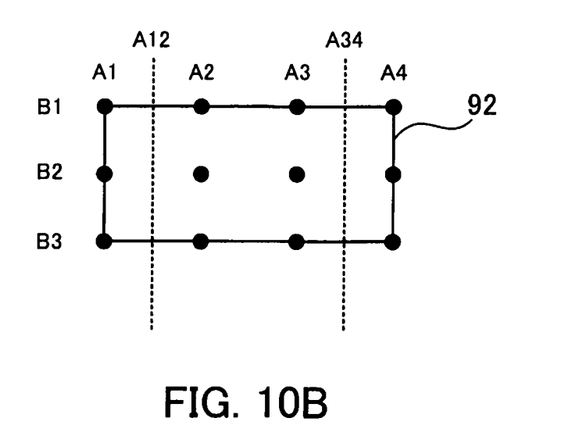

Therefore, if the method disclosed, for example, in Patent Document 1 is used for rearranging the left-hand and right-hand sides of the rectangle 91, then a result illustrated in FIG. 10B is obtained. In FIG. 10B, left-hand and right-hand sides of a rectangle 92 are arranged on the grid lines A1 and A4 respectively.

As a result, line width between the left-hand and right-hand sides before the shift differs from line width between the left-hand and right-hand sides after the shift. That is to say, a maximum error of distance between grid lines (=(distance between grid lines×0.5)×2 (number of sides)) is produced.

In recent years, however, the requirement of an error in line width has been very severe, so it is necessary to make an error in line width smaller than or equal to distance between grid lines.

Furthermore, if the requirement of an error in line width is met by making a grid finer as disclosed in Patent Document 2, data capacity or data processing time increases and a bad influence is exerted on efficiency.

SUMMARY

According to an aspect of the invention, there is provided a pattern generation method including a first process where a segment to be handled which is not on a grid is extracted, a second process where a second segment opposite to the segment to be handled is extracted, a third process where whether the second segment is on the grid is determined, and a fourth process where if the second segment is not on the grid, the segment to be handled and the second segment are shifted onto the grid so that line width between the segment to be handled and the second segment is closest to target line width.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will now be described in detail with reference to the accompanying drawings, wherein like reference numerals refer to like elements throughout.

Figure 1A:
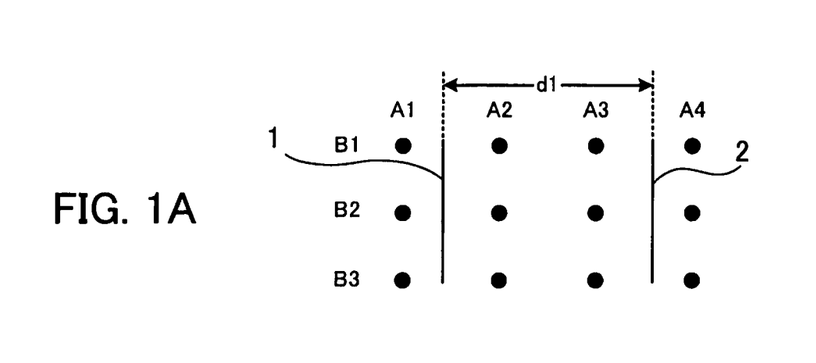
FIGS. 1A and 1B give an overview of an embodiment.
Figure 1B:
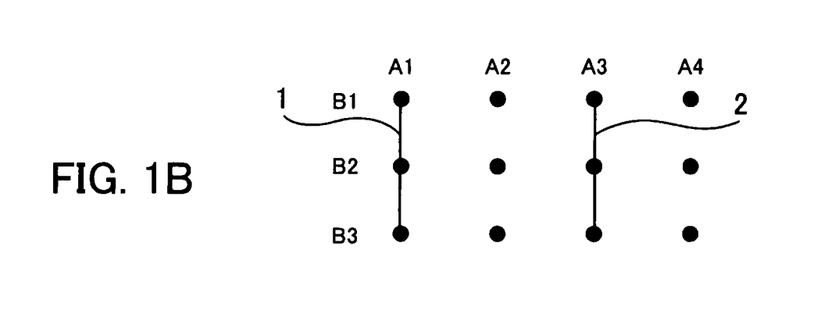

FIGS. 1A and 1B give an overview of a pattern generation method according to an embodiment.

A pattern generation method illustrated in FIG. 1 is a method for reducing an error in line width. The following first through fourth processes are performed, for example, on a pattern on which the OPC process or the like has been performed.

In the first process, as illustrated in FIG. 1A, a segment 1 to be handled which is not on a grid is extracted. In the second process, a second segment 2 opposite to the segment 1 is extracted.

In the third process, whether the segment 2 is on the grid is determined. In FIG. 1A, the segment 2 is not on the grid.

The segment 2 is not on the grid. Therefore, in the fourth process the segment 1 is shifted onto the grid under a determined condition. The segment 2 is shifted onto the grid so that line width between the segments 1 and 2 will be closest to target line width.

As illustrated in FIG. 1B, the segment 1 is arranged on a grid line A1 in accordance with the condition that "a segment is arranged on one of grid lines adjacent to the segment which is closer to the segment." If the target line width is the "closest to current line width d1," then the segment 2 is arranged on a grid line A3.

By doing so, an error in line width on the grid is smaller than distance between grid lines.

Figure 2:
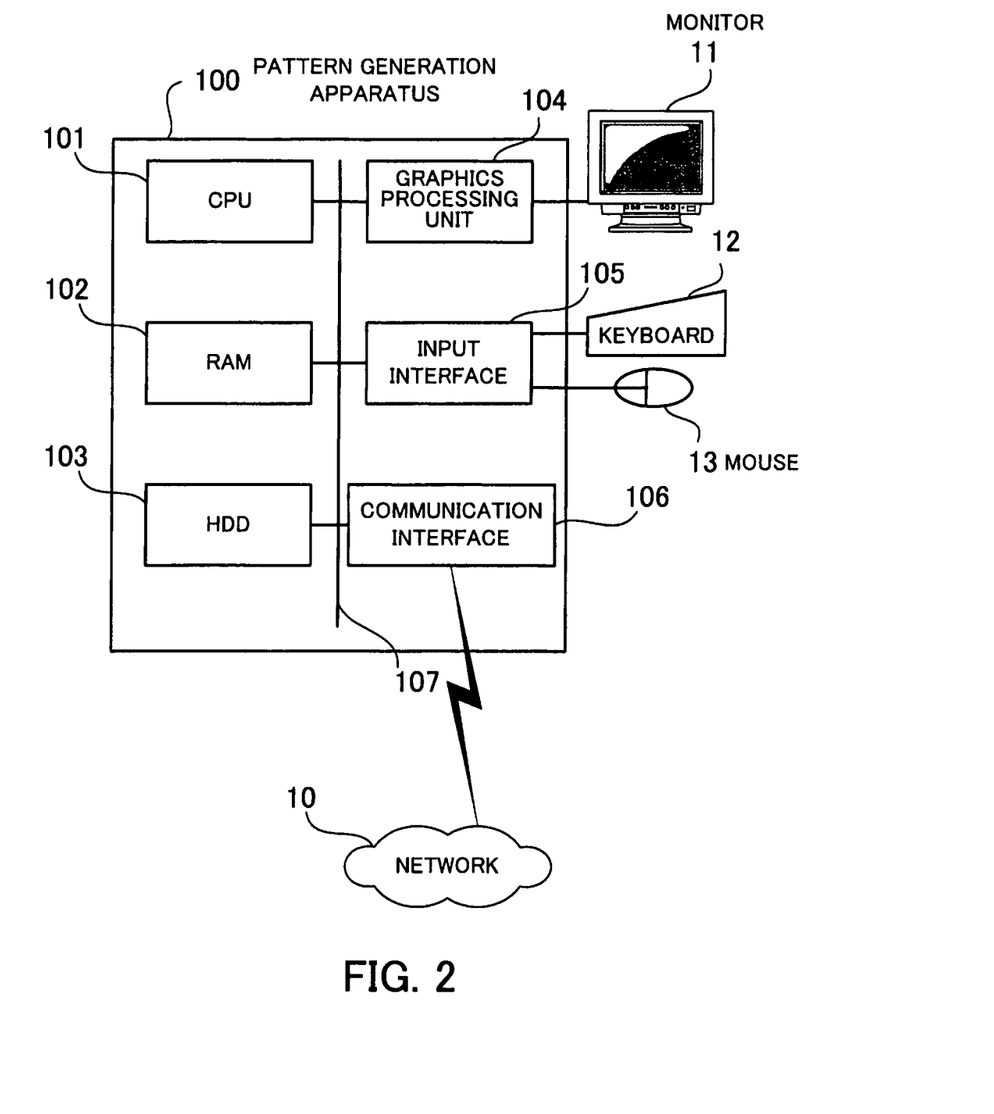
FIG. 2 illustrates an example of the hardware configuration of a pattern generation apparatus.

FIG. 2 illustrates an example of the hardware configuration of a pattern generation apparatus.

The whole of a pattern generation apparatus 100 is controlled by a CPU (Central Processing Unit) 101. A RAM (Random Access Memory) 102, a HDD (Hard Disk Drive) 103, a graphics processing unit 104, an input interface 105, and a communication interface 106 are connected to the CPU 101 via a bus 107.

The RAM 102 temporarily stores at least part of an OS (Operating System) or an application program executed by the CPU 101. The RAM 102 also stores various pieces of data which the CPU 101 needs to perform a process. The HDD 103 stores the OS and application programs. The HDD 103 also stores program files.

A monitor 11 is connected to the graphics processing unit 104. In accordance with instructions from the CPU 101, the graphics processing unit 104 displays an image on a screen of the monitor 11. A keyboard 12 and a mouse 13 are connected to the input interface 105. The keyboard 12 and the mouse 13 provide an interface with a user. The input interface 105 sends a signal sent from the keyboard 12 or the mouse 13 to the CPU 101 via the bus 107.

The communication interface 106 is connected to a network 10. The communication interface 106 sends data to and receives data from another computer via the network 10.

By adopting the above hardware configuration, the processing functions of this embodiment can be realized. A pattern is generated by a system in which the above hardware configuration is adopted, so the pattern generation apparatus 100 has the following functions.

Figure 3:
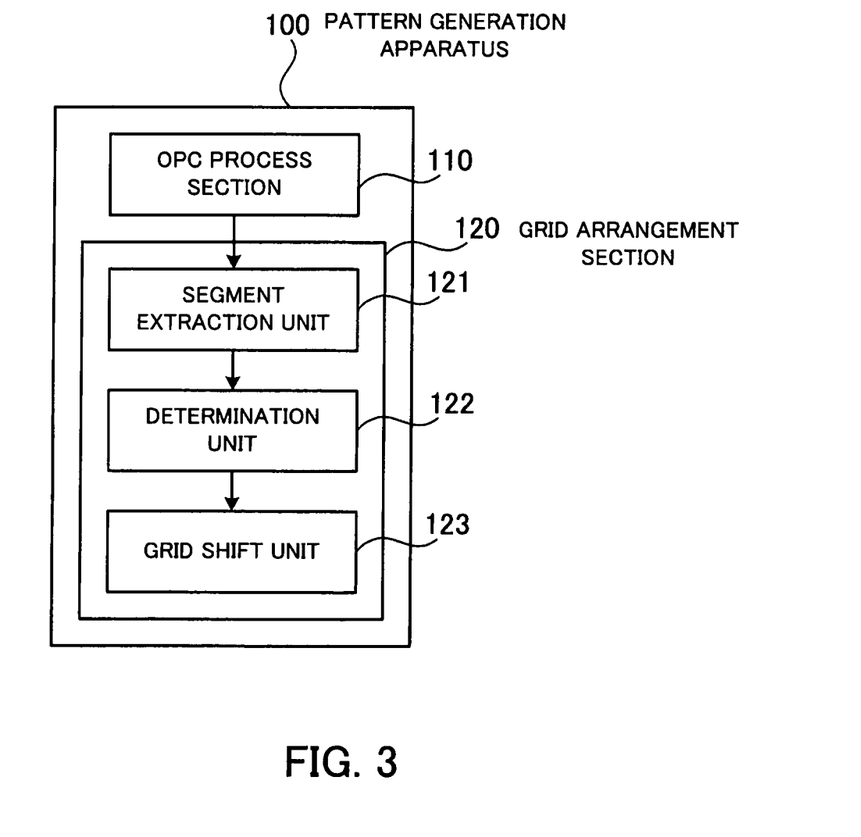
FIG. 3 is a block diagram of the functions of the pattern generation apparatus.

FIG. 3 is a block diagram of the functions of the pattern generation apparatus.

The pattern generation apparatus 100 includes an OPC process section 110 and a grid arrangement section 120.

The OPC process section 110 predicts the intensity of light used for actual exposure from distance between adjacent mask patterns indicated by pattern data, for example, in the GDS2 format, performs an OPC process for correcting a change in printed pattern width caused by light interference, and generates a pattern.

There is no special limitation on the pattern data. For example, the pattern data may be used for manufacturing various kinds of solid-state devices such as semiconductor devices and magnetic devices.

The grid arrangement section 120 includes a segment extraction unit 121, a determination unit 122, and a grid shift unit 123.

The segment extraction unit 121 extracts all off-grid segments from the pattern generated by the OPC process section 110.

The determination unit 122 determines whether there is a segment opposite to each of the off-grid segments extracted by the segment extraction unit 121. If there is a segment opposite to each of the off-grid segments extracted by the segment extraction unit 121, then the determination unit 122 determines whether the segment is an off-grid segment.

In the following description it is assumed that there is a segment opposite to an off-grid segment extracted by the segment extraction unit 121.

If one of the segments is an off-grid segment or both of the segments are off-grid segments, then the grid shift unit 123 arranges the segments on the grid with the relationship between the segments taken into consideration.

To be more concrete, the grid shift unit 123 compares line width obtained by arranging an off-grid segment on a grid line on which it may be arranged with current line width (target line width) and shifts the off-grid segment onto a grid line where line width which is closest to the current line width is obtained.

Processes performed by the grid arrangement section 120 will now be described.

First Process

Figure 4:
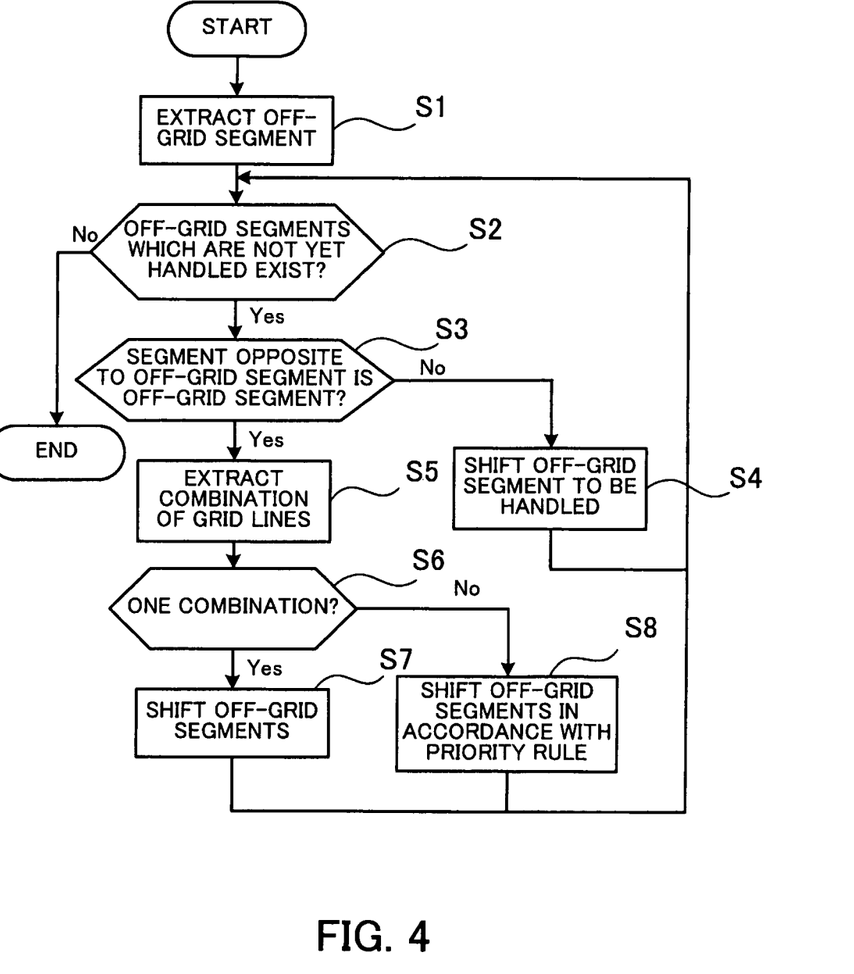
FIG. 4 is a flow chart of a first process performed by a grid arrangement section.

FIG. 4 is a flow chart of a first process performed by the grid arrangement section.

First the segment extraction unit 121 extracts an off-grid segment (step S1). The determination unit 122 then determines whether there are off-grid segments which are not yet handled (step S2).

If there are off-grid segments which are not yet handled ("Yes" in step S2), then the determination unit 122 determines whether a segment opposite to an off-grid segment (hereinafter referred to as the "off-grid segment to be handled") selected from among the off-grid segments which are not yet handled is an off-grid segment (step S3).

If the segment opposite to the off-grid segment to be handled is not an off-grid segment ("No" in step S3), then the off-grid segment to be handled is shifted onto one of two grid lines adjacent to the off-grid segment to be handled which is closer to the off-grid segment to be handled (step S4). After that, step S2 and the later steps are performed continuously.

On the other hand, if the segment opposite to the off-grid segment to be handled is an off-grid segment ("Yes" in step S3), then the grid shift unit 123 compares line width obtained for four arrangement combinations formed from two grid lines adjacent to the off-grid segment to be handled and two grid lines adjacent to the off-grid segment opposite to the off-grid segment to be handled with current line width and extracts a combination of grid lines for which line width is the closest to the current line width (step S5).

The grid shift unit 123 then determines whether the number of combinations extracted in step S5 is one (step S6). If the number of combinations extracted in step S5 is one ("Yes" in step S6), then the grid shift unit 123 shifts the off-grid segment to be handled and the off-grid segment opposite to the off-grid segment to be handled in accordance with the combination (step S7). After that, step S2 and the later steps are performed continuously.

On the other hand, if the number of combinations extracted in step S5 is not one ("No" in step S6), then the grid shift unit 123 shifts the off-grid segment to be handled and the off-grid segment opposite to the off-grid segment to be handled in accordance with a priority rule (segment which extends in the column direction must be shifted leftward or rightward and a segment which extends in the row direction must be shifted upward or downward) which is prescribed in advance and which the grid shift unit 123 has (step S8). After that, step S2 and the later steps are performed continuously.

On the other hand, if an off-grid segment which is not yet handled does not exist in step S2, that is to say, if all segments are arranged on the grid by performing steps S3 through S8 ("No" in step S2), then the grid arrangement section 120 terminates the process.

The description of the first process performed by the grid arrangement section 120 has been complete.

The first process performed by the grid arrangement section 120 will now be described by giving a concrete example.

Figure 5A:
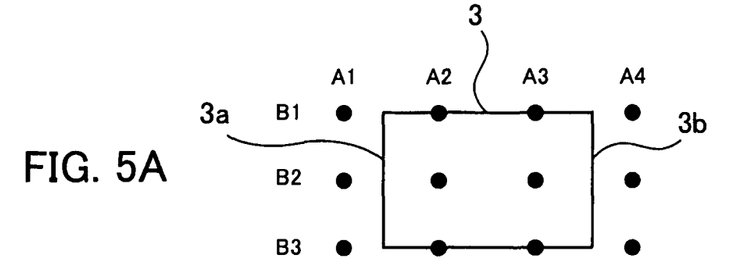
FIGS. 5A, 5B, and 5C illustrate a concrete example of the first process performed by the grid arrangement section.
Figure 5B:
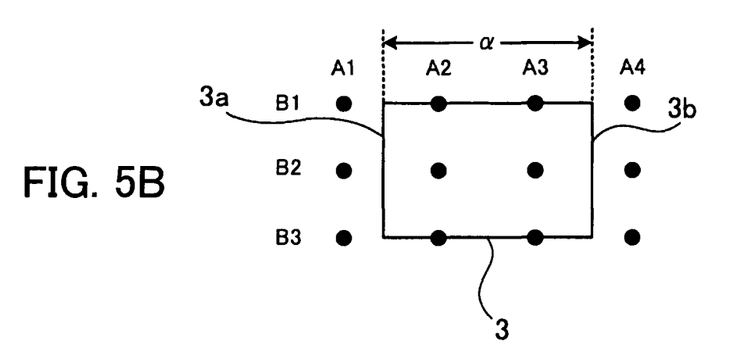
Figure 5C:
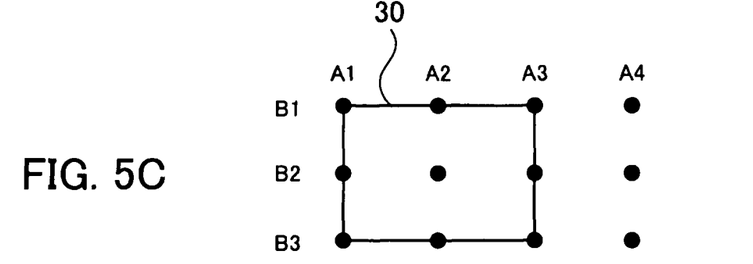

FIGS. 5A, 5B, and 5C illustrate a concrete example of the first process performed by the grid arrangement section.

First, as illustrated in FIG. 5A, the segment extraction unit 121 extracts sides 3a and 3b of a rectangle 3 as off-grid segments.

If the determination unit 122 selects the side 3a as an off-grid segment to be handled, then the determination unit 122 determines that the side 3b opposite to the side 3a is an off-grid segment.

Accordingly, the grid shift unit 123 extracts possible arrangement combinations for the sides 3a and 3b.

The possible arrangement combinations are (1) combination of arranging the side 3a on a grid line A1 and arranging the side 3b on a grid line A3, (2) combination of arranging the side 3a on the grid line A1 and arranging the side 3b on a grid line A4, (3) combination of arranging the side 3a on a grid line A2 and arranging the side 3b on the grid line A3, and (4) combination of arranging the side 3a on the grid line A2 and arranging the side 3b on the grid line A4.

Of these arrangement combinations, the above combinations (1) and (4) give line width which is the closest to current line width $\alpha$ (see FIG. 5B).

If the priority rule that a segment which extends in the column direction must be shifted leftward is prescribed in advance, then the grid shift unit 123 selects the above combination (1). That is to say, as illustrated in FIG. 5C, the grid shift unit 123 arranges the side 3a on the grid line A1 and arranges the side 3b on the grid line A3. As a result, a rectangle 30 each side of which is arranged on the grid is obtained.

An off-grid segment which is not yet handled does not exist, so the grid arrangement section 120 terminates the process.

In this concrete example, sides of the rectangle 3 which extend in the row direction are arranged on the grid. With some rectangles, two sides which extend in the row direction are off-grid segments and two sides which extend in the column direction are also off-grid segments. With such rectangles, the above process is performed for two sides which extend in the row (column) direction, and is performed again for two sides which extend in the column (row) direction.

Second Process

A second process performed by the grid arrangement section 120 will now be described.

The following description will center on the differences between the above first process and the second process. Descriptions of the same matters will be omitted.

The second process differs from the first process in the contents of steps performed by the grid shift unit 123.

Figure 6:
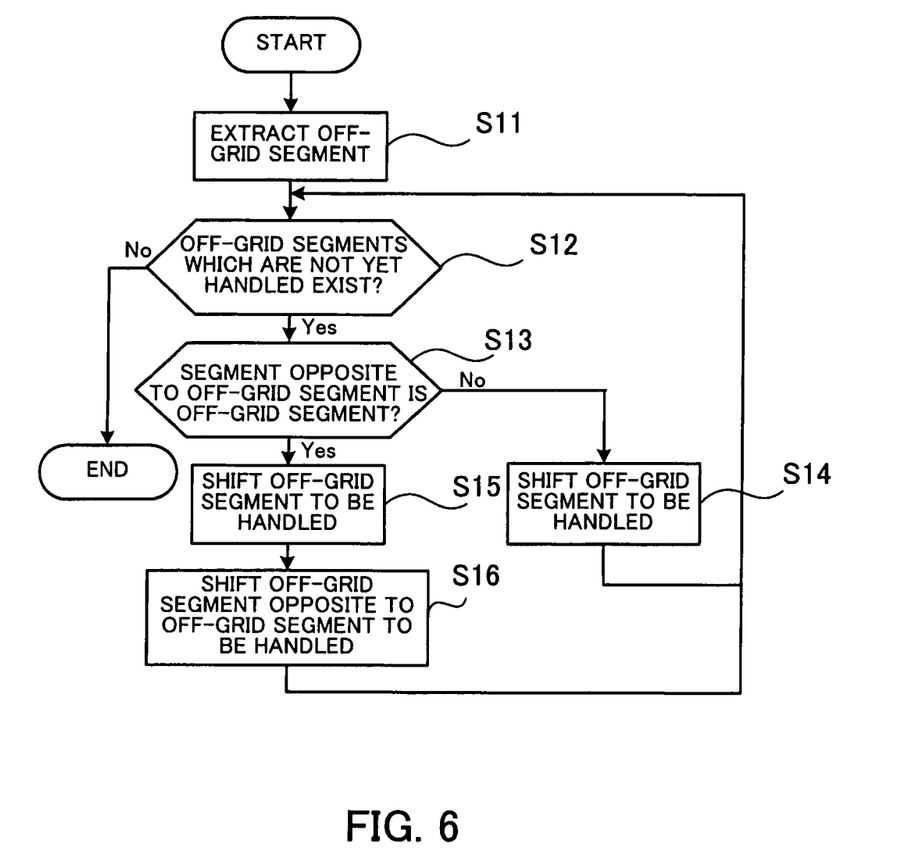
FIG. 6 is a flow chart of a second process performed by the grid arrangement section.

FIG. 6 is a flow chart of the second process performed by the grid arrangement section.

Steps S11 through S14 are the same as steps S1 through S4, respectively, of the first process.

If the segment opposite to the off-grid segment to be handled is an off-grid segment in step S13 ("Yes" in step S13), then the grid shift unit 123 shifts the off-grid segment to be handled onto the grid in accordance with a priority rule (left-hand segment must be arranged on a left-hand grid line, for example) which is prescribed in advance (step S15).

The grid shift unit 123 then shifts the off-grid segment opposite to the off-grid segment to be handled onto a grid line where line width which is the closest to current line width is obtained (step S16).

The description of the second process performed by the grid arrangement section 120 has been complete.

The same effect that is obtained by the first process can be achieved by the second process.

Third Process

A third process performed by the grid arrangement section 120 will now be described.

The following description will center on the differences between the above first process and the third process. Descriptions of the same matters will be omitted.

The third process differs from the first process in that data (hereinafter referred to as the "input data") outputted from the OPC process section 110 and inputted to the grid arrangement section 120 and data outputted from the grid arrangement section 120 are based on different grids.

Figure 7A:
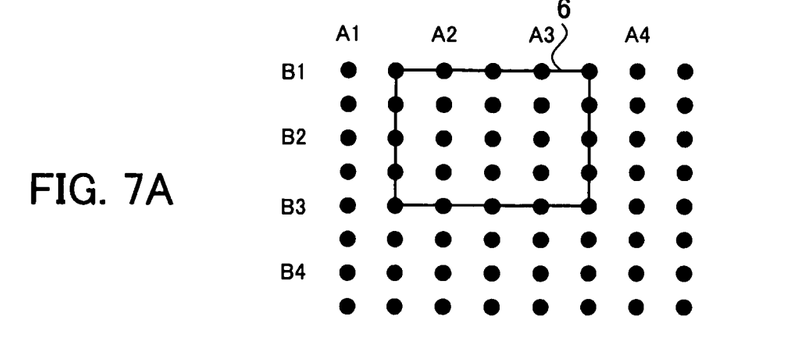
FIGS. 7A, 7B, and 7C illustrate an example of input data.
Figure 7B:
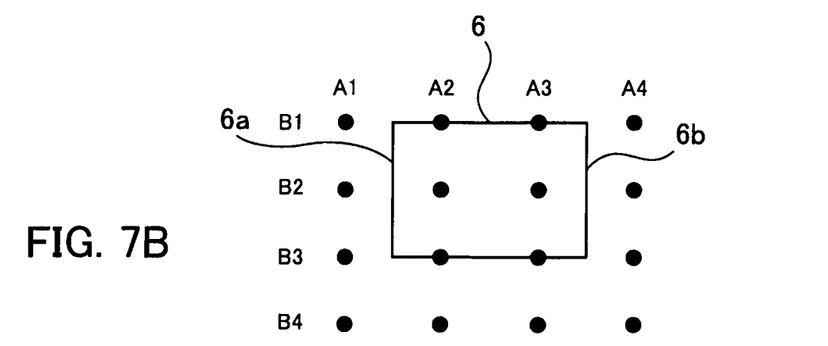
Figure 7C:
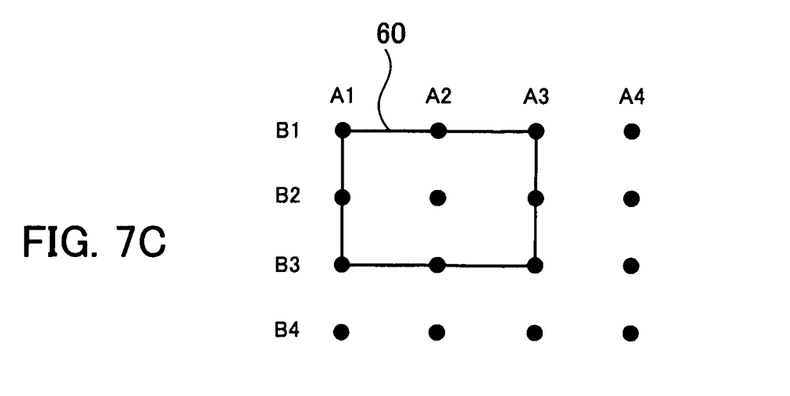

FIGS. 7A, 7B, and 7C illustrate an example of the input data.

As illustrated in FIG. 7A, the grid on which the input data is based is twice as fine as the grid on which the output data is based.

As illustrated in FIG. 7B, if the grid on which the input data is based is finer than the grid on which the output data is based, a segment in the input data which is arranged on the grid may become an off-grid segment in the output data.

Even in this case, it is necessary to arrange the off-grid segment on the grid.

With a rectangle 6, possible arrangement combinations are (1) combination of arranging a side 6a on a grid line A1 and arranging a side 6b on a grid line A3, (2) combination of arranging the side 6a on the grid line A1 and arranging the side 6b on a grid line A4, (3) combination of arranging the side 6a on a grid line A2 and arranging the side 6b on the grid line A3, and (4) combination of arranging the side 6a on the grid line A2 and arranging the side 6b on the grid line A4.

As stated above, the grid on which the input data is based is twice as fine as the grid on which the output data is based. Therefore, in the case of the above combination (1) or (4), an error in line width is "0." In the case of the above combination (2) or (3), however, an error in line width corresponding to the distance between grid lines occurs.

The sides 6a and 6b will be viewed independently of each other (their opposite sides will not be taken into consideration). The side 6a is at the same distance from the grid lines adjacent thereto. In addition, the side 6b is at the same distance from the grid lines adjacent thereto. Therefore, each of the above combinations (1) through (4) is created with the same probability.

Even in this case, according to this embodiment a priority rule is followed and an off-grid segment is shifted onto a grid line where line width is the closest to current line width. Accordingly, if the priority rule that a left-hand segment must be arranged on a left-hand grid line, for example, is followed, then a solution is determined uniquely. That is to say, as illustrated in FIG. 7C, a solution is the above combination (1). As a result, a rectangle 60 is obtained. In this case, each segment is arranged on the grid and an error in line width is "0."

In this embodiment the description has been given with the case where the grid on which the input data is based is twice as fine as the grid on which the output data is based as an example. However, the same effect can be obtained in the cases where a grid on which input data is based is three times or more as fine as a grid on which output data is based.

As has been described in the foregoing, with the pattern generation apparatus 100 according to this embodiment the grid arrangement section 120 arranges an off-grid segment on the grid with the relationship between the off-grid segment and another segment taken into consideration. Therefore, it is possible to reduce an error in line width caused by an off-grid state which arises at the time of generating pattern data from a maximum of the distance between grid lines to a maximum of half of the distance between grid lines without making the grid finer. As a result, the amount of data processed and processing time can be reduced.

In addition, an off-grid segment is shifted in accordance with a priority rule prescribed in advance. Accordingly, even if off-grid segments exist, for example, in succession in the row or column direction, it is possible to arrange them on the grid at certain intervals. For example, this prevents the following state from arising. One side of a figure is shifted rightward, one side of another figure is shifted leftward, and the distance between the two sides becomes very short. Compared with a conventional pattern generation apparatus, the amount of a margin left in advance with rearrangement taken into consideration can also be reduced.

In this embodiment, the first process, the second process, or the third process is performed after the OPC process. However, the first process, the second process, or the third process may be performed during the OPC process.

Furthermore, the first process, the second process, or the third process may be performed on the whole of a pattern on which the OPC process has been performed or the first process, the second process, or the third process may be performed only on a desired area of the pattern. In the latter case, the amount of data processed and processing time can be reduced further.

Moreover, current line width is set as target line width. However, there is no limitation on what target line width may be.

Applications

In the concrete example of the first process and the second process according to this embodiment, the descriptions are given with the rectangle 3 as an example. However, if a plurality of off-grid segments are opposite to one off-grid segment extracted by the segment extraction unit 121, then the following method may be used. The one off-grid segment is divided into parts and the above first or second process is performed on each of the parts corresponding to the plurality of off-grid segments opposite to the one off-grid segment (hereinafter referred to as the "first application").

In addition, the following method may be used. One of the plurality of off-grid segments opposite to the one off-grid segment is selected and the above first or second process is performed on the selected off-grid segment and the one off-grid segment. By doing so, the one off-grid segment is arranged on the grid. The remaining off-grid segment is shifted onto a grid line where line width is the closest to current line width with respect to the one off-grid segment arranged on the grid (hereinafter referred to as the "second application").

Figure 8A:
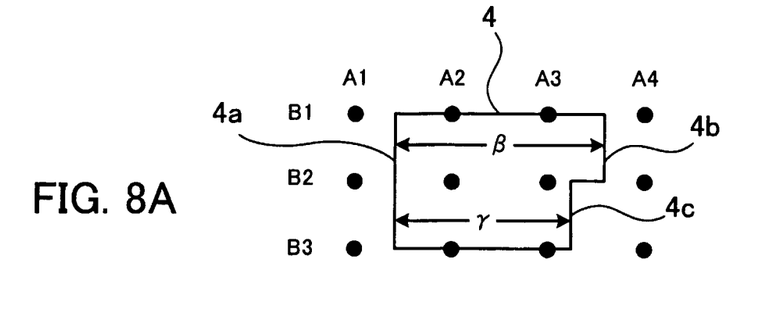
FIGS. 8A, 8B, 8C, and 8D illustrate an application.
Figure 8B:
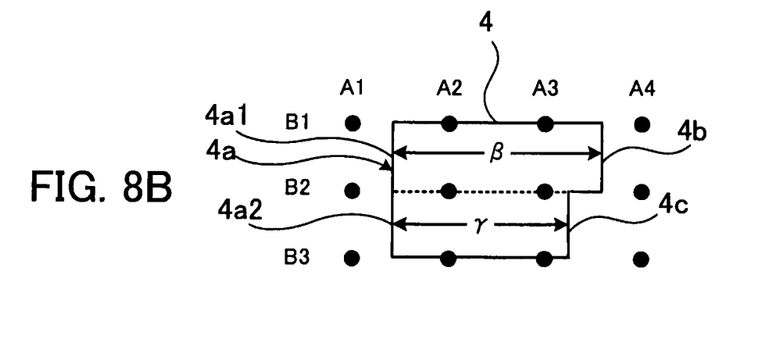
Figure 8C:
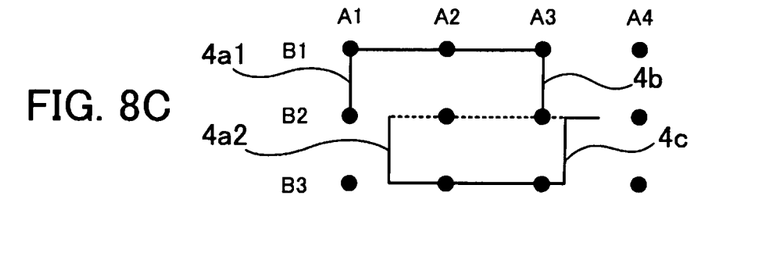
Figure 8D:
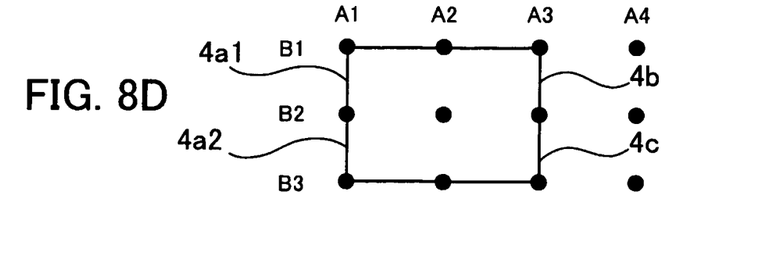
Figure 9A:
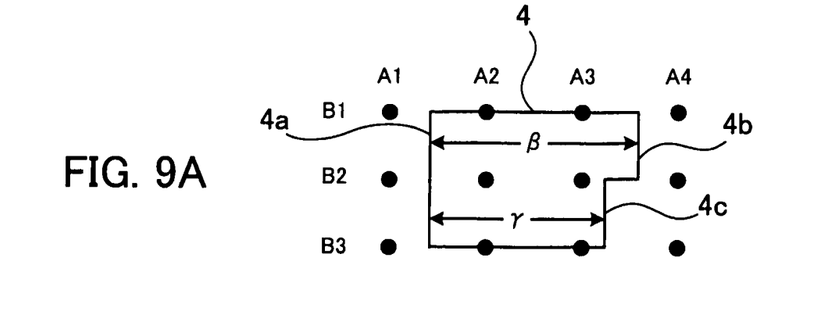
FIGS. 9A, 9B, and 9C illustrate an application.
Figure 9B:
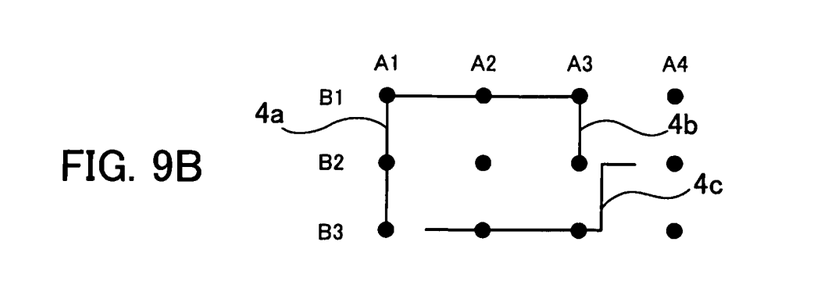
Figure 9C:
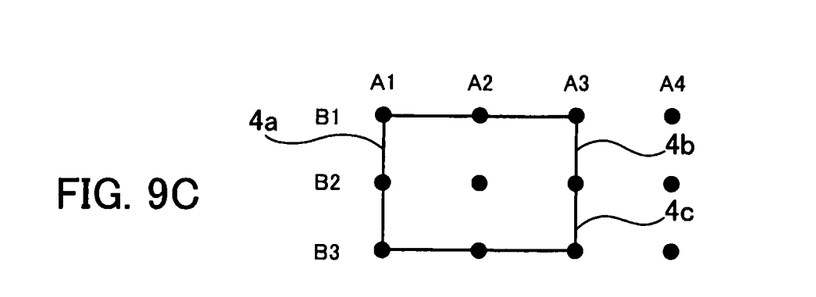

FIGS. 8 and 9 illustrate the applications.

FIG. 8A illustrates the case where an off-grid side 4a of a FIG. 4 extracted by the segment extraction unit 121 is opposite to off-grid sides 4b and 4c.

In the first application, as illustrated in FIG. 8B, the side 4a is divided into segments 4a1 and 4a2 corresponding to the sides 4b and 4c respectively.

With the segment 4a1 and the side 4b, as illustrated in FIG. 8C, a combination of arranging the segment 4a1 on a grid line A1 and arranging the side 4b on a grid line A3 which gives a line width that is the closest to current line width β is selected in accordance with the priority rule that a segment must be shifted leftward.

With the segment 4a2 and the side 4c, as illustrated in FIG. 8D, a combination of arranging the segment 4a2 on the grid line A1 and arranging the side 4c on the grid line A3 which gives a line width that is the closest to current line width γ is then selected in accordance with the priority rule that a segment must be shifted leftward.

In the second application, as illustrated in FIG. 9A, the side 4b of the sides 4b and 4c opposite to the side 4a of the FIG. 4 is selected. The above process is performed on the selected side 4b and the side 4a. By doing so, the side 4a is arranged on the grid line A1 and the side 4b is arranged on the grid line A3.

The remaining side 4c is shifted onto the grid line A3 where line width is the closest to the current line width γ with respect to the side 4a arranged on the grid line A1.

The above functions can be realized with a computer. In this case, a program in which the contents of the functions the pattern generation apparatus 100 should have are described is provided. By executing this program on the computer, the above functions are realized on the computer. This program can be recorded on a computer readable record medium. A computer readable record medium can be a magnetic recording device, an optical disk, a magneto-optical recording medium, a semiconductor memory, or the like. A magnetic recording device can be a HDD (Hard Disk Drive), a FD (Flexible Disk), a magnetic tape, or the like. An optical disk can be a DVD (Digital Versatile Disc), a DVD-RAM (Random Access Memory), a CD-ROM (Compact Disc-Read Only Memory), a CD-R (Recordable)/RW (ReWritable), or the like. A magneto-optical recording medium can be a MO (Magneto-Optical disk) or the like.

To place the program on the market, portable record media, such as DVDs or CD-ROMs, on which it is recorded are sold. Alternatively, the program is stored in advance on a hard disk in a server computer and is transferred from the server computer to another computer via a network.

When the computer executes the pattern generation program, it will store the program, which is recorded on a portable record medium or which is transferred from the server computer, on, for example, its hard disk. Then the computer reads the program from its hard disk and performs processes in compliance with the program. The computer can also read the program directly from a portable record medium and perform processes in compliance with the program. Furthermore, each time the program is transferred from the server computer, the computer can perform processes in turn in compliance with the program it receives.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A pattern generation method comprising:
   extracting a first segment which is not on grids by a segment extraction unit;
   extracting a second segment opposite to the first segment by the segment extraction unit;
   determining whether the second segment is on the grids by a determination unit;
   selecting, from the grids, a first grid which is adjacent to the first segment and a second grid which is adjacent to the second segment so that a space between the first grid and the second grid is closest to a target line width which is a line width between the first segment and the second segment by a grid shift unit, if the second segment is not on the grids; and
   shifting the first segment onto the first grid and the second segment onto the second grid by the grid shift unit, wherein:
   the shifting of the first segment and the second segment includes,
   obtaining a space between each of the grids adjacent to the first segment and each of the grids adjacent to the second segment;
   comparing the space between each of the grids adjacent to the first segment and each of the grids adjacent to the second segment with the target line width; and
   selecting the first grid and the second grid from each of the grids adjacent to the first segment and each of the grids adjacent to the second segment respectively after comparing.

2. The pattern generation method according to claim 1, wherein:
   the first segment is selected under a rule which determines a direction of the first segment shifted.

3. A pattern generation method comprising:
   extracting a first segment which is not on grids by a segment extraction unit;
   extracting a second segment opposite to the first segment by the segment extraction unit;
   determining whether the second segment is on the grids by a determination unit; and
   shifting the first segment onto a first grid which is selected from the grids adjacent to the first segment and the second segment onto a second grid which is selected from the grids adjacent to the second segment by a grid shift unit so that a space between the first grid and the second grid is closest to a target line width which is a line width between the first segment and the second segment before shifting the first segment and the second segment, if the second segment is not on the grids, wherein:
   the shifting of the first segment and the second segment includes,
   obtaining a space between each of the grids adjacent to the first segment and each of the grids adjacent to the second segment;
   comparing the space between each of the grids adjacent to the first segment and each of the grids adjacent to the second segment with the target line width; and
   selecting the first grid and the second grid from each of the grids adjacent to the first segment and each of the grids adjacent to the second segment respectively after comparing.

4. The pattern generation method according to claim 1, wherein, if there are a plurality of the first segments, the extracting the second segment, the determining whether the second segment is on the grids, and the shifting the first segment and the second segment are performed on each of the plurality of the first segments.

5. A non-transitory computer-readable storage medium on which a pattern generation program is recorded, the program making a computer:
   extract a first segment which is not on grids;
   extract a second segment opposite to the first segment;
   determine whether the second segment is on the grids;
   select, from the grids, in the case of the second segment not being on the grids, a first grid which is adjacent to the first segment and a second grid which is adjacent to the second segment so that a space between the first grid and the second grid is closest to a target line width which is a line width between the first segment and the second segment; and
   shift the first segment onto the first grid and the second segment onto the second grid,
   wherein:
   the shift of the first segment and the second segment includes,
   obtaining a space between each of the grids adjacent to the first segment and each of the grids adjacent to the second segment;
   comparing the space between each of the grids adjacent to the first segment and each of the grids adjacent to the second segment with the target line width; and
   selecting the first grid and the second grid from each of the grids adjacent to the first segment and each of the grids adjacent to the second segment respectively after the comparing.

* * * * *